US012635528B2

(12) United States Patent
Lin et al.

(10) Patent No.: US 12,635,528 B2
(45) Date of Patent: May 19, 2026

(54) SEMICONDUCTOR PACKAGE STRUCTURE HAVING ANTENNA ARRAY

(71) Applicant: MEDIATEK INC., Hsinchu City (TW)

(72) Inventors: Wun-Jian Lin, Hsinchu City (TW); Shih-Huang Yeh, Hsinchu City (TW); Chen-Hao Hsu, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 670 days.

(21) Appl. No.: 18/067,221

(22) Filed: Dec. 16, 2022

(65) Prior Publication Data

US 2023/0207499 A1      Jun. 29, 2023

Related U.S. Application Data

(60) Provisional application No. 63/294,120, filed on Dec. 28, 2021.

(51) Int. Cl.
*H10W 44/20* (2026.01)
*H01Q 1/22* (2006.01)
(Continued)

(52) U.S. Cl.
CPC .......... *H10W 44/20* (2026.01); *H01Q 1/2283* (2013.01); *H01Q 1/422* (2013.01); *H10W 70/65* (2026.01); *H10W 70/685* (2026.01); *H10W 70/688* (2026.01); *H10W 90/401* (2026.01); *H10W 90/701* (2026.01);
(Continued)

(58) Field of Classification Search
None
See application file for complete search history.

(56) References Cited

U.S. PATENT DOCUMENTS 9,331,030 B1 *  5/2016  Tsai ........................ H01L 24/20
2008/0191956 A1  8/2008  Watanabe
(Continued)

FOREIGN PATENT DOCUMENTS

TW            371110 U      9/1999

OTHER PUBLICATIONS

Chinese language office action dated Oct. 13, 2023, issued in application No. TW 111150371.
(Continued)

*Primary Examiner* — Nicholas J Tobergte
(74) *Attorney, Agent, or Firm* — McClure, Qualey & Rodack, LLP

(57) ABSTRACT

A semiconductor package structure is provided. The structure includes a package substrate having a first surface and a second surface opposite to the first surface and including a ground layer embedded therein. A semiconductor die is formed on the first surface of the package substrate and an antenna pattern layer is formed on the second surface of the package substrate and electrically coupled to the semiconductor die. The structure also includes a first connector and a second connector formed on the second surface of the package substrate and arranged adjacent to the antenna pattern layer. The first connector is electrically coupled to the semiconductor die and electrically isolated to the ground layer, and the second connector is electrically coupled to the ground layer. A wireless communication device including the semiconductor package structure is also provided.

16 Claims, 6 Drawing Sheets

(51) Int. Cl.

| | |
|---|---|
| *H01Q 1/42* | (2006.01) |
| *H10W 70/65* | (2026.01) |
| *H10W 70/67* | (2026.01) |
| *H10W 70/685* | (2026.01) |
| *H10W 90/00* | (2026.01) |

(52) U.S. Cl.
CPC ........ *H10W 44/212* (2026.01); *H10W 44/248* (2026.01); *H10W 90/724* (2026.01)

(56) References Cited

U.S. PATENT DOCUMENTS

| | | | |
|---|---|---|---|
| 2012/0193810 A1* | 8/2012 | Tsutsumi | H01L 23/66 257/E23.145 |
| 2018/0159217 A1* | 6/2018 | Mikata | H01L 23/552 |
| 2019/0103652 A1* | 4/2019 | Chuang | H01Q 1/22 |
| 2019/0288382 A1 | 9/2019 | Kamgaing et al. | |
| 2020/0013735 A1* | 1/2020 | Liu | H01L 23/481 |
| 2020/0273823 A1* | 8/2020 | Chen | H01L 23/49822 |
| 2021/0135333 A1* | 5/2021 | Ho | H01L 21/486 |
| 2021/0376493 A1 | 12/2021 | Shah et al. | |

OTHER PUBLICATIONS

Extended European Search Report dated Jul. 21, 2023, issued in application No. EP 22214783.7.
Holzwarth, S., et al.; "Integrated stacked patch antenna array on LTCC material operating at 24 GHz;" IEEE; Jun. 2004; pp. 1583-1586.

\* cited by examiner

SEMICONDUCTOR PACKAGE STRUCTURE HAVING ANTENNA ARRAY

CROSS REFERENCE TO RELATED APPLICATIONS

This application claims priority from U.S. provisional application No. 63/294,120 filed Dec. 28, 2021, the entirety of which is incorporated by reference herein.

BACKGROUND OF THE INVENTION

Field of the Invention

The disclosure relates to a semiconductor package, and in particular to a semiconductor package structure having an antenna array.

Description of the Related Art

Wireless electronic devices, such as cellular phones, notebooks, tablets, or smart watches typically include an antenna device (e.g., an antenna array) that are electrically coupled to transmitters and receivers for supporting communications. Such antenna devices may be disposed in a semiconductor package that includes one or more semiconductor chips/dies. To achieve higher bandwidth and higher data transmission rates for wireless electronic devices, millimeter wave (mmW) applications have been developed and introduced.

However, many technical challenges exist due to the introduction of millimeter wave transmission. For example, path loss during the signal propagate is one of the challenges.

BRIEF SUMMARY OF THE INVENTION

Embodiments of the present disclosure provide an improved semiconductor package structure with improved antenna configuration in order to address deficiencies and shortcomings, as mentioned above.

An embodiment of the present disclosure provides a semiconductor package structure. The semiconductor package structure includes a package substrate having a first surface and a second surface opposite to the first surface and including a ground layer embedded therein. The semiconductor package structure also includes a semiconductor die formed on the first surface of the package substrate. The semiconductor package structure further includes antenna pattern layers formed on the second surface of the package substrate and arranged in an array. In addition, the semiconductor package structure includes first connectors and second connectors formed on the second surface of the package substrate, and first pads correspondingly bonded to the first connectors. The first connectors and the second connectors are arranged in a first line and on a first side of the array. The first connectors are electrically isolated from the second connectors, and the second connectors are electrically coupled to the ground layer.

Another embodiment of the present disclosure provides a wireless communication device. The wireless communication device includes a flexible material substrate having an inner surface and an outer surface. The wireless communication device also includes a semiconductor package structure as mentioned above. Such a semiconductor package structure is disposed adjacent to the inner face of the flexible material substrate. The wireless communication device further includes second antenna pattern layers formed on the inner surface or the outer surface of the flexible material substrate. At least one of the second antenna pattern layers is electrically coupled to one of the first connectors.

Yet another embodiment of the present disclosure provides a semiconductor package structure. The semiconductor package structure includes a package substrate having a first surface and a second surface opposite to the first surface and including a ground layer embedded therein. The semiconductor package structure also includes a semiconductor die formed on the first surface of the package substrate. The semiconductor package structure further includes an antenna pattern layer formed on the second surface of the package substrate and electrically coupled to the semiconductor die. In addition, the semiconductor package structure includes a first connector and a second connector formed on the second surface of the package substrate and arranged adjacent to the antenna pattern layer. The first connector is electrically coupled to the semiconductor die and electrically isolated to the ground layer, and the second connector is electrically coupled to the ground layer.

BRIEF DESCRIPTION OF THE DRAWINGS

The present disclosure can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. In addition, the present disclosure may repeat reference numbers and/or letters in the various embodiments. This repetition is for the purpose of simplicity and clarity, and does not imply any relationship between the different embodiments and/or configurations discussed.

The present disclosure provides a wireless communication device with a semiconductor package structure. The semiconductor package includes at least one integrated circuit (IC) die attached to a package substrate in, for example, a "flip chip" configuration. In such a configuration, connectors (e.g., bumps) are formed on pads or terminals of the IC die, and the IC die may be inverted ("flipped") and attached to the package substrate so that connectors attach to corresponding pads on the surface of package substrate. The IC die may be one of the many types of IC dies. For example, IC die may be a radio-frequency IC (RFIC) die, a microprocessor die, an application-specific integrated circuit (ASIC), or a memory die according to various embodiments.

The package substrate may be one of the different types of substrates known to those skilled in the relevant arts (e.g., organic or inorganic substrates). The substrate may be made of one or more metal layers with one or more dielectric materials. Trace or routing patterns may be made in the metal layers by, for example, etching the metal layers. The substrate may be a single-layer, a two-layer, or multi-layer substrate.

The exemplary semiconductor package may be an RFIC die package with antenna array structure that is particularly suited for millimeter wave (mmW) applications or radar systems. However, it is to be appreciated that the principles of the present invention should not be limited to any particular package type or IC die.

Figures 1, 2:
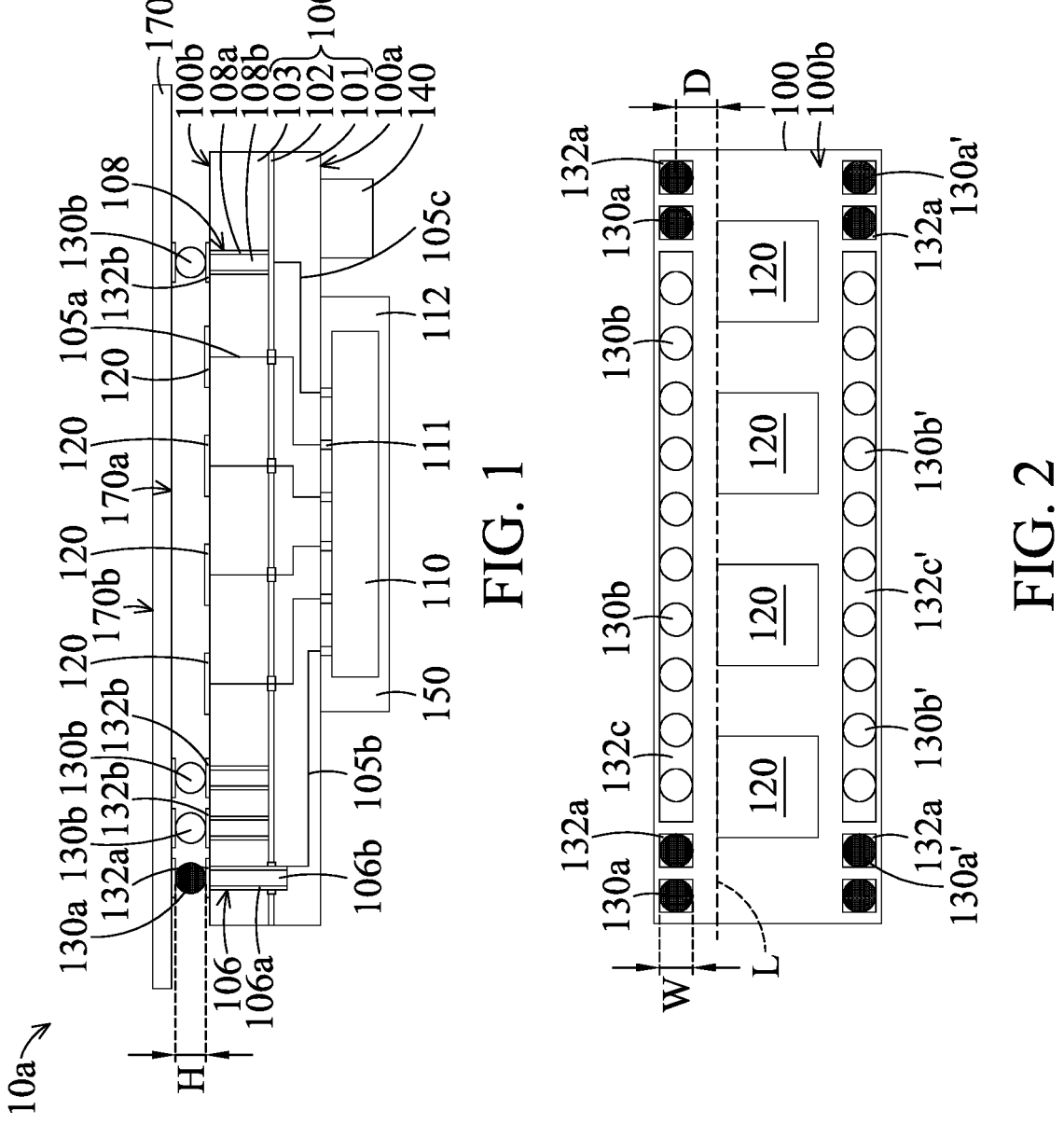
FIG. 1 illustrates a side view of a wireless communication device with a semiconductor package structure in accordance with some embodiments.
FIG. 2 illustrates a top view of a semiconductor package structure for a wireless communication device in accordance with some embodiments.

FIG. 1 illustrates a side view of a wireless communication device 10a in accordance with some embodiments. In some embodiments, the wireless communication device 10a includes a semiconductor package structure disposed adjacent to a flexible material substrate 170. More specifically, the semiconductor package structure includes a package substrate 100 having a first surface 100a and a second surface 100b opposite to the first surface 100a. The package substrate 100 may be a silicon interposer or a printed circuit board (PCB) and made of one or more metal layers with one or more dielectric materials. For example, the package substrate 100 is a multi-layer substrate including a metal layer 102 interposed between two dielectric layers 101 and 103. The metal layer 102 is embedded in the package substrate 100 to serve as a ground layer, and therefore, the metal layer 102 may be referred to as a ground layer. The dielectric layers 101 and 103 separated by the ground layer 102 may include polyimide, polymer, epoxy, or the like or any suitable dielectric material.

As shown in FIG. 1, the package substrate 100 have one or more conductive vias 106 and 108 formed in the dielectric layer 103 or in the dielectric layers 101 and 103. In some embodiments, each of the conductive vias 106 extends from the second surface 100b of the package substrate 100 into the dielectric layer 101, so that the conductive vias 106 pass through the dielectric layer 103 and the ground layer 102 and electrically isolated from the ground layer 102. Each of the conductive vias 106 may include a dielectric material 106b surrounded by a conductive layer 106a. Unlike to the conductive vias 106, each of the conductive vias 108 extends from the second surface 100b of the package substrate 100 onto the ground layer 102, so that the conductive vias 106 pass through the dielectric layer 103 and are electrically coupled to the ground layer 102. Similar to the conductive vias 106, each of the conductive vias 108 may include a dielectric material 108b surrounded by a conductive layer 108a.

Moreover, the package substrate 100 have conductive traces formed on the second surface 100b of the package substrate 100 for signal, ground, and/or power routing. In some embodiments, some of such conductive traces may be in the form of pads (e.g., first pads 132a) for signal routing. Those pads (e.g., first pads 132a, which are also referred to as signal pads) are correspondingly bonded to and electrically coupled to the conductive vias 106. Further, some of such conductive traces may be in the form of pads (e.g., second pads 132b) for ground routing. Those pads (e.g., second pads 132b, which are also referred to as ground pads) are correspondingly bonded to and electrically coupled to the conductive vias 108. In addition, some of such conductive traces may be in the form of antenna pattern (e.g., one or more antenna pattern layers 120). In some embodiments, the antenna pattern layers 120 form an antenna element that includes an antenna array or a device for radiating and/or receiving electro-magnetic signals such as RF wireless signals or millimeter-wave (mmW) signals. Such an antenna element may be a patch antenna, a slot antenna, a dipole antenna, a dielectric resonator antenna (DRA), a planar inverted-F antenna (PIFA) or the like.

Referring to FIG. 1, the semiconductor package structure also includes a semiconductor die (or semiconductor chip) 110 formed on the first surface 100a of the package substrate 100. The semiconductor die 110 may include an RFIC die, system-on-chip (SoC) die, a base-band IC die or the like. In some embodiments, the semiconductor die 110 is bonded onto the first surface 100a of the package substrate 100 via connectors 111 that are disposed between the semiconductor die 110 and the first surface 100a of the package substrate 100. For example, the connectors 111 may include solder balls, solder bumps, copper posts, copper bumps, gold bumps, or any suitable conductive connector. In some embodiments, the semiconductor die 110 is electrically coupled to the antenna pattern layers 120 by interconnect structures 105a. The semiconductor die 110 is also electrically coupled to the conductive vias 106 and 108 by interconnect structures 105b and 105c, respectively. Each interconnect structure may include one or more conductive lines and/or vias. Herein, in order to simplify the diagram, solid lines are depicted to represent those interconnect structures 105a, 105b and 105c.

In some embodiments, the semiconductor die 110 is enclosed by an encapsulating layer 150. For example, the encapsulating layer 150 may include a molding compound material. The molding compound material may be a polymer material, such as an epoxy-based resin, an underfill material, or the like or any suitable encapsulating material.

Referring to FIG. 1 again, the semiconductor package structure further includes connectors formed on the first and second surfaces 100a and 100b of the package substrate 100 in accordance with some embodiments. In some embodiments, first connectors 130a and second connectors 130b are formed on the second surface 100b of the package substrate 100 and arranged adjacent to the antenna pattern layers 120.

The first connectors 130*a* are correspondingly bonded to the first pads 132*a* and the second connectors 130*b* are correspondingly bonded to the second pads 132*b*, so as to be electrically coupled to the semiconductor die 110. In those cases, the first connectors 130*a* serve as signal connectors and the second connectors 130*b* serve as ground connectors. Each of the first connectors 130*a* is electrically isolated to the ground layer 102 and each of the second connectors 130*b*. Each of the second connectors 130*b* is electrically coupled to the ground layer 102.

Moreover, one or more third connectors 140 are formed on the first surface 100*a* of the package substrate 100. The third connectors 140 are correspondingly bonded to the pads (not shown) formed on the first surface 100*a* of the package substrate 100, so as to be electrically coupled to the semiconductor die 110 via interconnect structures (not shown) formed in the dielectric layer 101. In those cases, the third connectors 140 electrically couple the semiconductor die 110 to an external circuit (not shown), such as a printed circuit board (PCB) or a main board.

The first connector 130*a*, the second connector 130*b* and the third connector 140 may include solder balls, solder bumps, copper posts, copper bumps, gold bumps, or any suitable conductive connector. Moreover, the size of the third connector 140 is different than that of the first and second connectors 130*a* and 130*b*. For example, the size of the third connector 140 is greater than that of the first and second connectors 130*a* and 130*b*.

In some embodiments, the flexible material substrate 170 disposed adjacent to the semiconductor package structure has an inner surface 170*a* and an outer surface 170*b* opposite to the inner surface 170*a*. In those cases, such a semiconductor package structure is disposed adjacent to the inner face 170*a* of the flexible material substrate 170. Moreover, the second surface 100*b* of the package substrate 100 faces the inner surface 170*a* of the flexible material substrate 170 and separated from the flexible material substrate 170 by the first connectors 130*a* and the second connectors 130*b*. As a result, the flexible material substrate 170 is spaced apart from the package substrate 100 by a distance that is substantially equal to the height H of the first and second connectors 130*a* and 130*b*. In some embodiments, the height H of the first and second connectors 130*a* and 130*b* is in a range from about λ/100 to about λ/25, where λ is a wavelength of radio waves transmitted/received by the antenna pattern layers 120. For example, the height H of the first and second connectors 130*a* and 130*b* is in a range from about 100 μm to about 430 μm. In some embodiments, the flexible material substrate 170 may be made of polymer, such as PI (Polyimide), polyethylene terephthalate (PET), polyethylene naphthalate (PEN), cyclenes copolymer (COC), cyclic olefin polymer (COP), or any suitable flexible material.

FIG. 2 illustrates a top view of a semiconductor package structure for a wireless communication device in accordance with some embodiments. Descriptions of elements of the embodiments hereinafter that are the same as or similar to those previously described with reference to FIG. 1 may be omitted for brevity. As shown in FIG. 2, the antenna pattern layers 120 formed on the second surface 100*b* of the package substrate 100 are arranged in an array (e.g., a linear array) in accordance with some embodiments. Therefore, the antenna pattern layers 120 is also referred to as an antenna array 120. It should be noted that the number of antenna pattern layers 120 shown in FIG. 2 is only an example and are not a limitation to that disclosed in the embodiments. First connectors 130*a* and second connectors 130*b* are arranged in a line and on a first side of the antenna array 120, and third connectors 130*a*' and fourth connectors 130*b*' are arranged in a line and on a second side of the antenna array 120 (which is opposite to the first side of the antenna array 120). In those cases, the third connectors 130*a*' serve as signal connectors. The configuration, the material, and the dimension of each third connector 130*a*' may be the same or similar to those of each first connector 130*a*. Moreover, the third connectors 130*a*' are also electrically coupled to the semiconductor die 100 (not shown and indicated in FIG. 1) by a method similar to that of the first connectors 130*a*. For example, each third connector 130*a*' is electrically coupled to the semiconductor die 100 via a corresponding signal pad 132*a*, a corresponding conductive via (not shown) and a corresponding interconnect structure (not shown).

In those cases, the fourth connectors 130*b*' serve as ground connectors. The configuration, the material, and the dimension of each fourth connector 130*b*' may be the same or similar to those of each second connector 130*b*. Moreover, the fourth connectors 130*b*' are also electrically coupled to the semiconductor die 100 (not shown and indicated in FIG. 1) by a similar method to that of the second connectors 130*b*. For example, the second connectors 130*b* arranged on the first side of the antenna array 120 are bonded to a common ground pad 132*c* and the fourth connectors 130*b*' arranged on the second side of the antenna array 120 are bonded to a common ground pad 132*c*'. Those common ground pad 132*c* and 132*c*' are electrically coupled to the semiconductor die 100 via one or more corresponding conductive vias (not shown), the ground layer 102 (not shown and indicated in FIG. 1) and one or more corresponding interconnect structures (not shown). As a result, the third connectors 130*a*' are electrically isolated from the fourth connectors 130*b*' (which are electrically coupled to the ground layer 120).

In some embodiments, a width W of the first and second connectors 130*a* and 130*b* is substantially equal to the height H of the first and second connectors 130*a* and 130*b* (as indicated in FIG. 1). In other words, the width W is in a range from about λ/100 to about λ/25. For example, the width W is in a range from about 100 μm to about 430 μm. Similarly, the third and fourth connectors 130*a*' and 130*b*' have a width that is substantially the same as the width W of the first and second connectors 130*a* and 130*b*.

Referring to FIG. 2 again, in some embodiments, the minimum distance D between the center of each of the first connector 130*a* and the second connector 130*b* and a virtual line L extending along the edge of one of the antenna pattern layers 120 (the one that faces the first connector 130*a* and the second connector 130*b*) is in a range from about λ/35 to about λ/20. For example, the minimum distance D may be in a range from about 306 μm to about 535 μm.

Figures 3, 4:
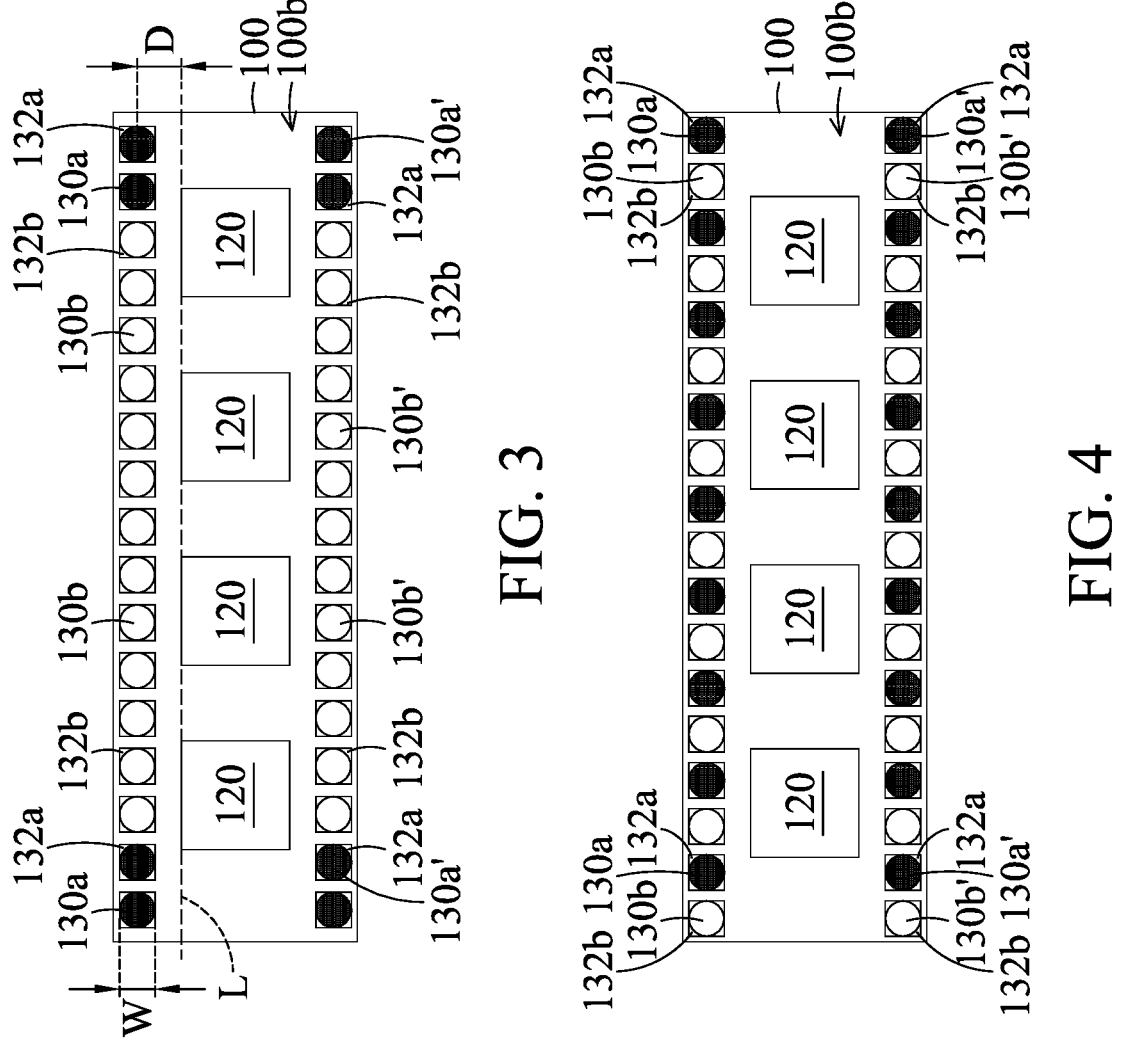
FIG. 3 illustrates a top view of a semiconductor package structure for a wireless communication device in accordance with some embodiments.
FIG. 4 illustrates a top view of a semiconductor package structure for a wireless communication device in accordance with some embodiments.

FIG. 3 illustrates a top view of a semiconductor package structure for a wireless communication device in accordance with some embodiments. Descriptions of elements of the embodiments hereinafter that are the same as or similar to those previously described with reference to FIG. 2 may be omitted for brevity. In some embodiments, the semiconductor package structure is similar to the semiconductor package structure shown in FIG. 2, except that the configuration of the ground pads. More specifically, first pads 132*a* arranged on the first side of the antenna array 120 are correspondingly bonded to the first connectors 130*a*. Second pads 132*b* arranged on the first side of the antenna array 120 are correspondingly bonded to the second connectors 130*b*. Similarly, first pads 132*a* arranged on the second side of the antenna array 120 (which may be referred to as third pads) are correspondingly bonded to the third connectors 130*a*'.

Second pads 132*b* arranged on the second side of the antenna array 120 (which may be referred to as fourth pads) are correspondingly bonded to the fourth connectors 130*b'*.

It should be note that the first connectors 130*a* and the third connectors 130*a'* have a symmetrical arrangement with respect to the antenna array 120 and the second connectors 130*b* and the fourth connectors 130*b'* have a symmetrical arrangement with respect to the antenna array 120. However, in some other embodiments, the first and second connectors 130*a* and 130*b* are asymmetrical to the third and fourth connectors 130*a'* and 130*b'* with respect to the antenna array 120.

FIG. 4 illustrates a top view of a semiconductor package structure for a wireless communication device in accordance with some embodiments. Descriptions of elements of the embodiments hereinafter that are the same as or similar to those previously described with reference to FIG. 3 may be omitted for brevity. In some embodiments, the semiconductor package structure is similar to the semiconductor package structure shown in FIG. 3, except that the arrangement of the signal and ground pads. More specifically, first connectors 130*a* and second connectors 130*b* are alternately arranged in a line and on a first side of the antenna array 120. Similarly, third connectors 130*a'* and fourth connectors 130*b'* are alternately arranged in a line and on a second side of the antenna array 120 (which is opposite to the first side of the antenna array 120).

It should be note that the first connectors 130*a* and the third connectors 130*a'* have a symmetrical arrangement with respect to the antenna array 120 and the second connectors 130*b* and the fourth connectors 130*b'* have a symmetrical arrangement with respect to the antenna array 120. However, in some other embodiments, the alternately arranged first and second connectors 130*a* and 130*b* are asymmetrical to the alternately arranged third and fourth connectors 130*a'* and 130*b'* with respect to the antenna array 120.

Figures 5, 6:
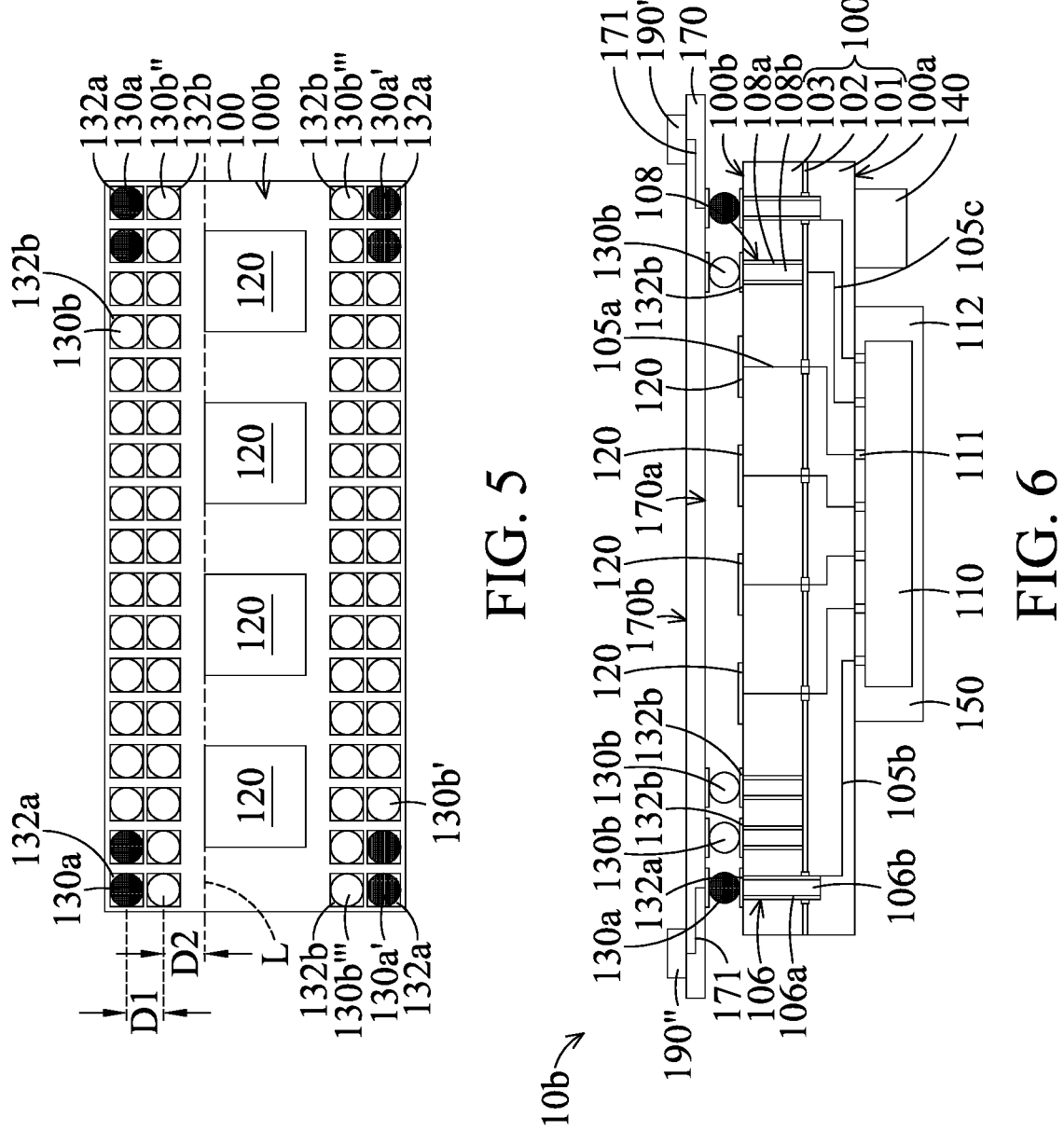
FIG. 5 illustrates a top view of a semiconductor package structure for a wireless communication device in accordance with some embodiments.
FIG. 6 illustrates a side view of a wireless communication device with a semiconductor package structure in accordance with some embodiments.

FIG. 5 illustrates a top view of a semiconductor package structure for a wireless communication device in accordance with some embodiments. Descriptions of elements of the embodiments hereinafter that are the same as or similar to those previously described with reference to FIG. 3 may be omitted for brevity. In some embodiments, the semiconductor package structure is similar to the semiconductor package structure shown in FIG. 3, except that the arrangement of the signal and ground pads. More specifically, additional fifth connectors 130*b"* are formed on the second surface 100*b* of the package substrate 100. The fifth connectors 130*b"* are arranged in a line and between the antenna array 120 and the first and second connectors 130*a* and 130*b*. In those cases, the fifth connectors 130*b"* serve as ground connectors and are electrically coupled to the ground layer 102 (not shown and indicated in FIG. 1). Second pads 132*b* are arranged between the antenna array 120 and the first and second connectors 130*a* and 130*b* (which may be referred to fifth pads) and correspondingly bonded to the fifth connectors 130*b"*.

Moreover, additional sixth connectors 130*b'''* are also formed on the second surface 100*b* of the package substrate 100. The sixth connectors 130*b'''* are arranged in a line and between the antenna array 120 and the third and fourth connectors 130*a'* and 130*b'*. In those cases, the sixth connectors 130*b'''* also serve as ground connectors and are electrically coupled to the ground layer 102 (not shown and indicated in FIG. 1). Second pads 132*b* are arranged between the antenna array 120 and the third and fourth connectors third and fourth (which may be referred to sixth pads) and correspondingly bonded to the sixth connectors 130*b'''*.

Referring to FIG. 5, in some embodiments, the distance D1 from the center of the first connector 130*a* or the second connector 130*b* to the center of the fifth connector 130*b"* is in a range from about 350 μm to about 800 μm. Similarly, the distance from the center of the third connector 130*a'* or the fourth connector 130*b'* to the center of the sixth connector 130*b'''* is in a range from about 350 μm to about 800 μm.

Moreover, the minimum distance D2 between the center of each fifth connector 130*b"* and the virtual line L extending along the edge of an antenna array 120 (the one that faces the fifth connectors 130*b"*) is in a range from about $\lambda/35$ to about $\lambda/20$. For example, the minimum distance D2 may be in a range from about 306 μm to about 535 μm. Similarly, the minimum distance between the center of each sixth connector 130*b'''* and the virtual line extending along the edge of an antenna array 120 (the one that faces the sixth connectors 130*b'''*) is in a range from about $\lambda/35$ to about $\lambda/20$. For example, this minimum distance may be in a range from about 306 μm to about 535 μm.

Referring to FIG. 5 again, two columns of connectors including first, second, and fifth connectors 130*a*, 130*b* and 130*b"* arranged on the first side of the antenna array 120 and two columns of connectors including third, fourth, and sixth connectors 130*a'*, 130*b'* and 130*b'''* arranged on the second side of the antenna array 120 are only an example and are not a limitation to that disclosed in the embodiments. For example, three columns of connectors may be arranged on the first and/or second sides of the antenna array 120.

FIG. 6 illustrates a side view of a wireless communication device 10*b* in accordance with some embodiments. Descriptions of elements of the embodiments hereinafter that are the same as or similar to those previously described with reference to FIG. 1 may be omitted for brevity. In some embodiments, the wireless communication device 10*b* is similar to the wireless communication device 10*a* shown in FIG. 1. Unlike the wireless communication device 10*a* shown in FIG. 1, additional second antenna pattern layers 190' (which may be referred to second antenna array) are formed on the outer surface 170*b* of the flexible material substrate 170. Moreover, at least one of the second antenna pattern layers 190' is electrically coupled to one of the signal connectors (e.g., the first connectors 130*a*) via one of interconnect structures 171 formed in the flexible material substrate 170. For example, each of the second antenna pattern layers 190' may be electrically coupled to the corresponding first connector 130*a*. Alternatively, additional third antenna pattern layers 190" (which may be referred to third antenna array) are formed on the outer surface 170*b* of the flexible material substrate 170 except the second antenna pattern layers 190' (i.e., the second antenna array). Similarly, at least one of the third antenna pattern layers 190" is electrically coupled to one of the signal connectors via one of interconnect structures 171. For example, each of the third antenna pattern layers 190" may be electrically coupled to the corresponding first connector 130*a*.

In accordance with some embodiments, the configuration and/or the arrangement of the signal connectors/pads and those of the ground connectors/pads shown in FIGS. 2 to 5 can be applied in the wireless communication device 10*b* shown in FIG. 6.

Figures 7, 8:
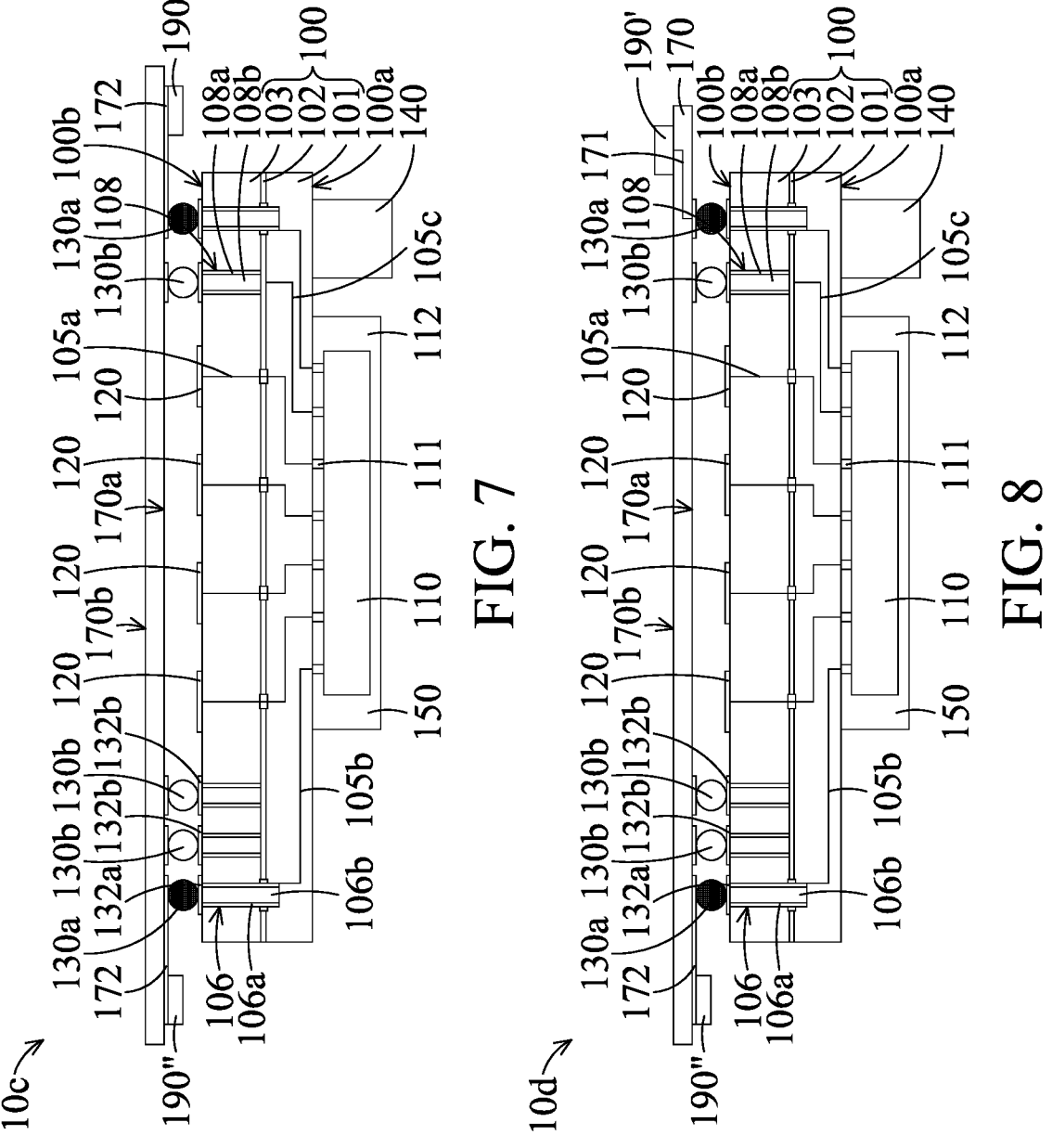
FIG. 7 illustrates a side view of a wireless communication device with a semiconductor package structure in accordance with some embodiments.
FIG. 8 illustrates a side view of a wireless communication device with a semiconductor package structure in accordance with some embodiments.

FIG. 7 illustrates a side view of a wireless communication device 10*c* in accordance with some embodiments. Descriptions of elements of the embodiments hereinafter that are the same as or similar to those previously described with reference to FIG. 1 or 6 may be omitted for brevity. In some embodiments, the wireless communication device 10c is similar to the wireless communication device 10b shown in FIG. 6. Unlike the wireless communication device 10b shown in FIG. 6, additional second antenna pattern layers 190' and/or additional third antenna pattern layers 190" are formed on the inner surface 170a of the flexible material substrate 170. Moreover, at least one of the second antenna pattern layers 190' and/or at least one of the third antenna pattern layers 190" is/are electrically coupled to the signal connector(s) (e.g., the first connector(s) 130a) via conductive traces 172 formed on the inner surface 170a of the flexible material substrate 170.

In accordance with some embodiments, the configuration and/or the arrangement of the signal connectors/pads and those of the ground connectors/pads shown in FIGS. 2 to 5 can be applied in the wireless communication device 10c shown in FIG. 7.

FIG. 8 illustrates a side view of a wireless communication device with a semiconductor package structure in accordance with some embodiments. Descriptions of elements of the embodiments hereinafter that are the same as or similar to those previously described with reference to FIG. 6 or 7 may be omitted for brevity. In some embodiments, the wireless communication device 10d is similar to the wireless communication device 10b shown in FIG. 6 or the wireless communication device 10c shown in FIG. 7. Unlike the wireless communication device 10b shown in FIG. 6 and the wireless communication device 10c shown in FIG. 7, additional second antenna pattern layers 190' are formed on the outer surface 170b of the flexible material substrate 170 and additional third antenna pattern layers 190" are formed on the inner surface 170a of the flexible material substrate 170.

Moreover, at least one of the second antenna pattern layers 190' is electrically coupled to one of the signal connectors (e.g., the first connectors 130a) via one of interconnect structures 171 formed in the flexible material substrate 170. At least one of the third antenna pattern layers 190" is electrically coupled to one of the signal connectors (e.g., the first connectors 130a) via one of conductive traces 172 formed on the inner surface 170a of the flexible material substrate 170. For example, each of the second antenna pattern layers 190' may be electrically coupled to the corresponding first connector 130a. Moreover, each of the third antenna pattern layers 190" may be electrically coupled to the corresponding first connector 130a.

In accordance with some embodiments, the configuration and/or the arrangement of the signal connectors/pads and those of the ground connectors/pads shown in FIGS. 2 to 5 can be applied in the wireless communication device 10d shown in FIG. 8.

Figures 9, 10A:
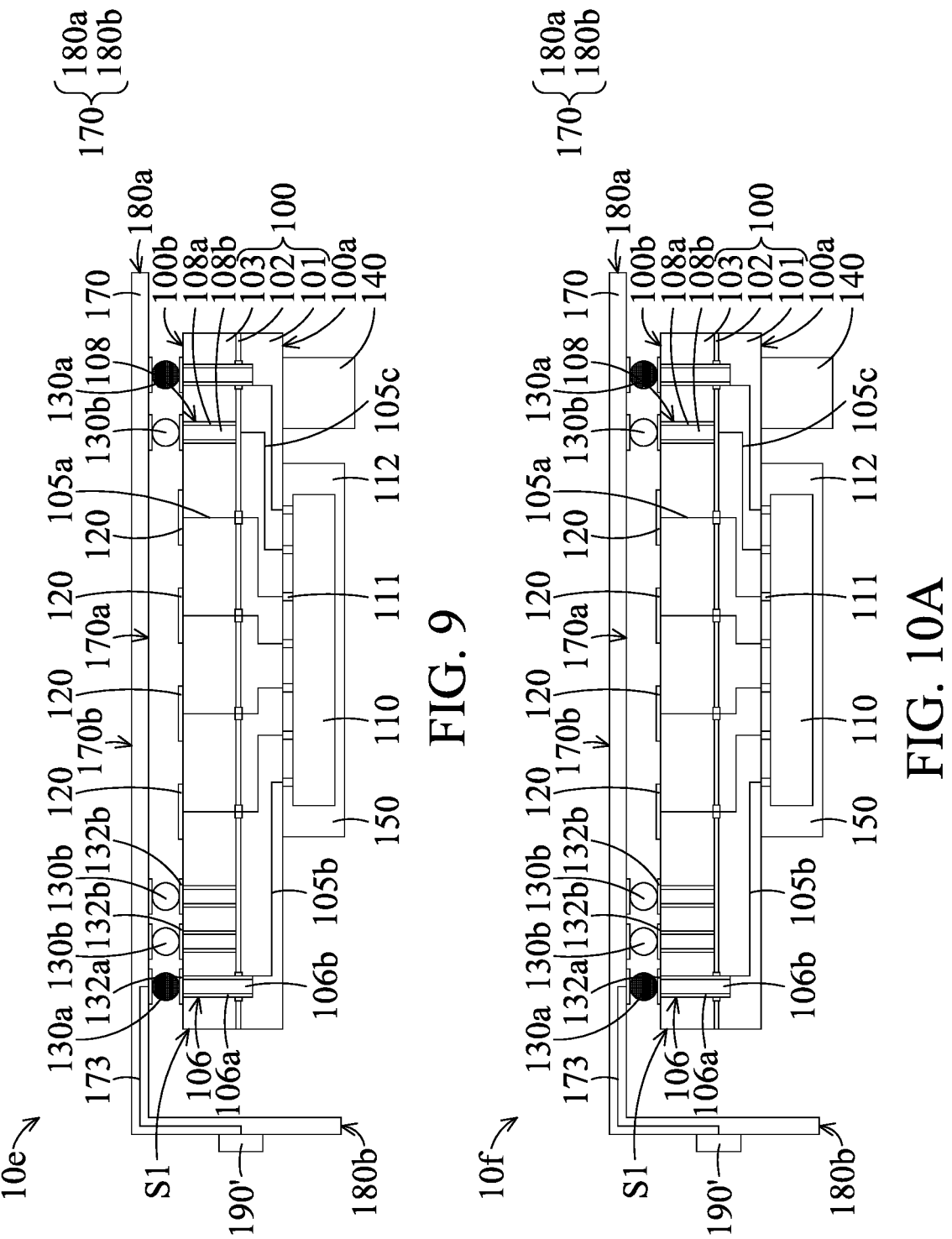
FIG. 9 illustrates a side view of a wireless communication device with a semiconductor package structure in accordance with some embodiments.
FIG. 10A illustrates a side view of a wireless communication device with a semiconductor package structure in accordance with some embodiments.

FIG. 9 illustrates a side view of a wireless communication device 10e in accordance with some embodiments. Descriptions of elements of the embodiments hereinafter that are the same as or similar to those previously described with reference to FIG. 1 or 6 may be omitted for brevity. In some embodiments, the wireless communication device 10e is similar to the wireless communication device 10b shown in FIG. 6, except the shape of the flexible material substrate 170. Unlike the wireless communication device 10b shown in FIG. 6, the flexible material substrate 170 includes a plate portion 180a having a longitudinal direction parallel to X direction. The flexible material substrate 170 also includes a wall portion 180b extending along Z direction (which is vertical to X direction). In some embodiments, the plate portion 180a faces the second surface 100b of the package substrate 100 and the antenna array 120 are arranged in a line extending along X direction. Moreover, the wall portion 180b extends from an end of the plate portion 180a and has an inner surface facing a sidewall S1 of the package substrate 100. In some embodiments, one or more second antenna pattern layers 190' are formed on the wall portion 180b. For example, a second antenna pattern layer 190' may be formed on the outface of the wall portion 180b and may be electrically coupled to the corresponding signal connector (e.g., the first connector 130a) via the corresponding interconnector structure 173 formed in the flexible material substrate 170, as shown in FIG. 9. Alternatively, the second antenna pattern layer 190' may be formed on the inner surface of the wall portion 180b (i.e., the inner surface 170a of the flexible material substrate 170). The second antenna pattern layer 190' may be electrically coupled to the corresponding signal connector (e.g., the first connector 130a) via the corresponding conductive trace (not shown) formed on the inner surface 170a of the flexible material substrate 170.

In accordance with some embodiments, the configuration and/or the arrangement of the signal connectors/pads and those of the ground connectors/pads shown in FIGS. 2 to 5 can be applied in the wireless communication device 10e shown in FIG. 9.

Figure 10B:
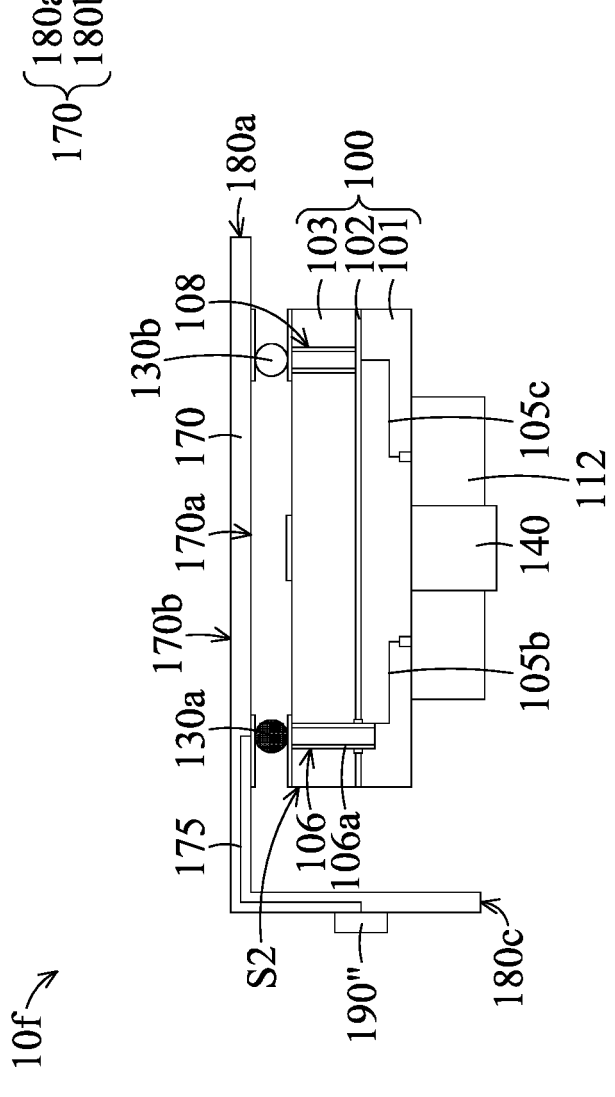
FIG. 10B illustrates another side view of the wireless communication device shown in FIG. 10A in accordance with some embodiments

FIGS. 10A and 10B illustrate different side views of a wireless communication device 10f in accordance with some embodiments, in which FIG. 10A shows a side view of the wireless communication device 10f corresponding to a X-Z plane, and FIG. 10B shows a side view of the wireless communication device 10f corresponding to a Y-Z plane. Descriptions of elements of the embodiments hereinafter that are the same as or similar to those previously described with reference to FIG. 9 may be omitted for brevity. In some embodiments, the wireless communication device 10f is similar to the wireless communication device 10e shown in FIG. 9, except the shape of the flexible material substrate 170. More specifically, as shown in FIG. 10A, the flexible material substrate 170 of the wireless communication device 10f includes a plate portion 180a having a longitudinal direction parallel to X direction and a wall portion 180b extending along Z direction. Moreover, one or more second antenna pattern layers 190' are formed on the wall portion 180b. In some embodiments, the flexible material substrate 170 of the wireless communication device 10f in the side view corresponding to the X-Z plane is the same as flexible material substrate 170 of the wireless communication device 10e in the side view corresponding to the X-Z plane (as shown in FIG. 9).

As shown in FIG. 10B, the flexible material substrate 170 of the wireless communication device 10f further includes a wall portion 180c extending along Z direction. In some embodiments, the wall portion 180c extends from an end of the plate portion 180a and has an inner surface facing a sidewall S2 of the package substrate 100. In those cases, the sidewall S2 of the package substrate 100 is adjacent to the sidewall S1 of the package substrate 100 (which is shown in FIG. 10A). In some embodiments, one or more third antenna pattern layers 190" are formed on the wall portion 180c. For example, a third antenna pattern layer 190" may be formed on the outface of the wall portion 180c and may be electrically coupled to the corresponding signal connector (e.g., the first connector 130a) via the corresponding interconnector structure 175 formed in the flexible material substrate 170, as shown in FIG. 10B. Alternatively, the third antenna pattern layer 190" may be formed on the inner surface of the wall portion 180c (i.e., the inner surface 170a of the flexible material substrate 170). The third antenna pattern layer 190" may be electrically coupled to the corresponding signal connector (e.g., the first connector 130*a*) via the corresponding conductive trace (not shown) formed on the inner surface 170*a* of the flexible material substrate 170.

In accordance with some embodiments, the configuration and/or the arrangement of the signal connectors/pads and those of the ground connectors/pads shown in FIGS. 2 to 5 can be applied in the wireless communication device 10*f* shown in FIGS. 10A and 10B.

According to the foregoing embodiments, the semiconductor package structure is designed to fabricate an antenna integrated into the semiconductor package structure. In the semiconductor package structure, it allows that the wireless communication device can effectively reduce path loss for the antenna system during the signal propagate. More specifically, the antenna system is formed on a package substrate where a semiconductor die is bonded by the use of connectors (e.g., solder balls or bump structures). Compare to an antenna system separated from the package substrate with a semiconductor die/chip, the semiconductor package structure integrated with the antenna system can effectively reduce the signal propagation path, so as to enhance the performance of the wireless communication device.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:
a package substrate having a first surface and a second surface opposite to the first surface and comprising a ground layer embedded therein;
a semiconductor die formed on the first surface of the package substrate;
an antenna pattern layer formed on the second surface of the package substrate and electrically coupled to the semiconductor die;
a first connector and a second connector formed on the second surface of the package substrate and arranged adjacent to the antenna pattern layer, wherein the first connector is electrically coupled to the semiconductor die and electrically isolated to the ground layer, and the second connector is electrically coupled to the ground layer; and
a first conductive via extending from the second surface and passing through the ground layer; and
a second conductive via extending from the second surface onto the ground layer,
wherein the first conductive via and the second first conductive via are electrically coupled to the first connector and the second connector, respectively.

2. The semiconductor package structure as claimed in claim 1, wherein each of the first conductive via and the second conductive via comprises a dielectric material surrounded by a conductive layer.

3. The semiconductor package structure as claimed in claim 1, wherein each of the first connector and the second connector has a height in a range from about λ/100 to about λ/25, where λ is a wavelength of radio waves transmitted/received by the antenna pattern layer.

4. The semiconductor package structure as claimed in claim 1, wherein a minimum distance between a center of each of the first connector and the second connector and a line extending along an edge of one of the antenna pattern layer that faces the first connector and the second connector is in a range from about λ/35 to about λ/20, where λ is a wavelength of radio waves transmitted/received by the antenna pattern layer.

5. The semiconductor package structure as claimed in claim 1, further comprising:
a third connector formed on the first surface of the package substrate, wherein a size of the third connector is different than a size of the first and second connectors; and
an encapsulating layer enclosing the semiconductor die.

6. A semiconductor package structure, comprising:
a package substrate having a first surface and a second surface opposite to the first surface and comprising a ground layer embedded therein;
a semiconductor die formed on the first surface of the package substrate;
a plurality of antenna pattern layers formed on the second surface of the package substrate and arranged in an array;
a plurality of first connectors and a plurality of second connectors formed on the second surface of the package substrate;
a plurality of first pads correspondingly bonded to the plurality of first connectors; and
a plurality of first conductive vias extending from the second surface and passing through the ground layer; and
a second plurality of conductive vias extending from the second surface onto the ground layer,
wherein the plurality of first conductive vias and the plurality of second first conductive vias are electrically coupled to the plurality of first connectors and the plurality of second connectors, respectively,
wherein the plurality of first connectors and the plurality of second connectors are arranged in a first line and on a first side of the array, and
wherein the plurality of first connectors is electrically isolated from the plurality of second connectors, and the plurality of second connectors is electrically coupled to the ground layer.

7. The semiconductor package structure as claimed in claim 6, further comprising a second pad bonded to each of the plurality of second connectors.

8. The semiconductor package structure as claimed in claim 7, further comprising:
a plurality of third connectors and a plurality of fourth connectors formed on the second surface of the package substrate, wherein the plurality of third connectors and the plurality of fourth connectors are arranged in a second line and on a second side of the array opposite to the first side thereof; and
a plurality of third pads correspondingly bonded to the plurality of third connectors and a fourth pad bonded to each of the plurality of fourth connectors,
wherein the plurality of third connectors is electrically isolated from the plurality of fourth connectors, and the plurality of fourth connectors is electrically coupled to the ground layer.

9. The semiconductor package structure as claimed in claim 6, further comprising a plurality of second pads correspondingly bonded to the plurality of second connectors.

10. The semiconductor package structure as claimed in claim 9, further comprising:

a plurality of third connectors formed on the second surface of the package substrate, wherein the plurality of third connectors is electrically coupled to the ground layer; and a plurality of third pads correspondingly bonded to the plurality of third connectors, wherein the plurality of third connectors is arranged in a second line, between the array and the plurality of first connectors and between the array and the plurality of second connectors.

11. The semiconductor package structure as claimed in claim 10, wherein a minimum distance between a center of one of the plurality of third connectors and a line extending along an edge of one of the plurality of antenna pattern layers that faces the plurality of third connectors is in a range from about $\lambda/35$ to about $\lambda/20$, where $\lambda$ is a wavelength of radio waves transmitted/received by the plurality of antenna pattern layers.

12. The semiconductor package structure as claimed in claim 9, further comprising:

a plurality of third connectors and a plurality of fourth connectors formed on the second surface of the package substrate, wherein the plurality of third connectors and the plurality of fourth connectors are arranged in a second line and on a second side of the array opposite to the first side of the array; and a plurality of third pads correspondingly bonded to the plurality of third connectors and a plurality of fourth pads correspondingly bonded to the plurality of fourth connectors, wherein the plurality of third connectors is electrically isolated from the plurality of fourth connectors, and the plurality of fourth connectors is electrically coupled to the ground layer.

13. The semiconductor package structure as claimed in claim 12 wherein the plurality of first connectors and a plurality of second connectors are alternately arranged along the first line, and the plurality of third connectors and a plurality of fourth connectors are alternately arranged along the second line.

14. The semiconductor package structure as claimed in claim 12, further comprising:

a plurality of fifth connectors formed on the second surface of the package substrate, wherein the plurality of fifth connectors is electrically coupled to the ground layer;

a plurality of fifth pads correspondingly bonded to the plurality of fifth connectors, wherein the plurality of fifth connectors is arranged in a third line, between the array and the plurality of first connectors and between the array and the plurality of second connectors;

a plurality of sixth connectors formed on the second surface of the package substrate, wherein the plurality of sixth connectors is electrically coupled to the ground layer; and a plurality of sixth pads correspondingly bonded to the plurality of sixth connectors, wherein the plurality of sixth connectors is arranged in a fourth line and between the array and the pluralities of third and fourth connectors.

15. The semiconductor package structure as claimed in claim 6, wherein each of the first connector and the second connector has a height in a range from about $\lambda/100$ to about $\lambda/25$, where $\lambda$ is a wavelength of radio waves transmitted/received by the plurality of antenna pattern layers.

16. The semiconductor package structure as claimed in claim 6, further comprising:

a third connector formed on the first surface of the package substrate, wherein a size of the third connector is different than a size of the first and second connectors; and an encapsulating layer enclosing the semiconductor die.

* * * * *